(12) United States Patent  (10) Patent No.: US 7,479,727 B1
Grace                     (45) Date of Patent:     Jan. 20, 2009

(54) APPARATUS AND METHOD FOR PYROELECTRIC AND PIEZOELECTRIC POWER GENERATION AND THERMOELECTRIC HEAT TRANSFER

(76) Inventor: Winston Grace, 6195 Rock Island Rd., #302, Tamarac, FL (US) 33319

( * ) Notice: Subject to any disclaimer, the term of this patent is extended or adjusted under 35 U.S.C. 154(b) by 0 days.

(21) Appl. No.: 11/489,126

(22) Filed: Jul. 19, 2006

Related U.S. Application Data

(60) Provisional application No. 60/701,118, filed on Jul. 20, 2005.

(51) Int. Cl.
  *H02N 2/00* (2006.01)
  *H01L 41/00* (2006.01)
(52) U.S. Cl. .................. 310/339; 310/306; 310/313 R; 310/319; 310/348
(58) Field of Classification Search .................. 310/361, 310/306, 308, 324, 339
  See application file for complete search history.

(56) References Cited

U.S. PATENT DOCUMENTS

| 3,575,641 A | | 4/1971 | Long |
| 4,220,906 A | | 9/1980 | Drummond |
| 4,425,540 A | * | 1/1984 | Olsen .......................... 322/2 A |
| 4,441,067 A | | 4/1984 | O'Hare |
| 4,647,836 A | * | 3/1987 | Olsen .......................... 322/2 A |
| 4,877,988 A | * | 10/1989 | McGinniss et al. .......... 310/306 |
| 4,904,894 A | * | 2/1990 | Henry et al. ................. 310/328 |
| 5,065,085 A | * | 11/1991 | Aspden et al. ............... 322/2 R |
| 5,288,336 A | * | 2/1994 | Strachan et al. ............. 136/200 |
| 5,376,184 A | * | 12/1994 | Aspden ...................... 136/203 |
| 5,438,553 A | * | 8/1995 | Wilson et al. ............... 367/140 |
| 5,644,184 A | * | 7/1997 | Kucherov ................... 310/306 |
| 2005/0012434 A1 | * | 1/2005 | Pizzochero et al. ......... 310/339 |

* cited by examiner

*Primary Examiner*—Jeffrey Donels
*Assistant Examiner*—Christopher Uhlir
(74) *Attorney, Agent, or Firm*—Malin Haley DiMaggio Bowen & Lhota, P.A.

(57) ABSTRACT

A roof system for a building is adapted to harness pyroelectric and piezoelectric effects to generate electric power. A roof system is provided wherein roof tiles, or other covering structure, are adapted with piezoelectric materials capable of converting mechanical energy from falling rain into electric energy by compression or deformation of the piezoelectric material, and further adapted with a pyroelectric system that generates electric power from temperature changes. The use of polyvinylidene fluoride, a material having both piezoelectric and pyroelectric characteristics, is discloses as a preferred material for accomplishing the goals of the present invention. The power generated supplies thermoelectric cooling systems that provide temperature conditioning of the building's interior space.

5 Claims, 3 Drawing Sheets

APPARATUS AND METHOD FOR PYROELECTRIC AND PIEZOELECTRIC POWER GENERATION AND THERMOELECTRIC HEAT TRANSFER

CROSS REFERENCE TO RELATED APPLICATIONS

This application claims the benefit of provisional U.S. Patent Application Ser. No. 60/701,118, filed Jul. 20, 2005.

STATEMENT REGARDING FEDERALLY SPONSORED RESEARCH OR DEVELOPMENT

N/A

COPYRIGHT NOTICE

A portion of the disclosure of this patent document contains material that is subject to copyright protection. The copyright owner has no objection to the facsimile reproduction by anyone of the patent document or patent disclosure as it appears in the Patent and Trademark Office patent file or records, but otherwise reserves all copyrights rights whatsoever.

BACKGROUND OF THE INVENTION

1. Field of the Invention

The present invention relates generally to the generation of electrical power, and more particularly adapting houses, buildings, and other, structures adapted with pyroelectric, piezoelectric, and thermoelectric systems capable of generating electrical power.

2. Description of the Background Art

The cost and availability of electricity varies throughout the world. In certain parts of the world electricity is provided by reliable power systems at relatively economical prices. However, in less developed parts of the world the supply of electricity is unreliable, and completely unavailable in remote locations. As a result, there exists a need for simple and cost efficient generation of electrical power on a localized basis. This need is particularly relevant in third world countries wherein electrical power is not readily available.

Building conventional power-generating facilities, such as oil or coal fired power plants, is costly and impractical, particularly for remote areas. In addition, solar and wind power systems also fail to provide a sufficient power generating solution due to cost and reliability. Accordingly, the present inventor suggests that a non-conventional approach to generating electrical power on a localized basis is needed. More particularly, the present invention is directed to the localized generation of electricity using pyroelectric and piezoelectric systems.

Pyroelectric systems generate power by converting heat to electrical energy. Piezoelectric systems rely on a permanently-polarized material such as quartz ($SiO_2$) or barium titanate ($BaTiO_3$) which produce an electric field when the material changes dimensions as a result of an imposed mechanical force. These materials are piezoelectric, and this phenomenon is known as the piezoelectric effect. Examples of systems using piezoelectric and pyroelectric effects are found in the prior art.

For example, U.S. Pat. No. 4,904,894, issued to Henry et al., discloses a hail sensor containing a piezoelectric transducer positioned to produce an electrical output signal when vibrated by a hailstone.

U.S. Pat. No. 4,220,906, issued to Drummond, discloses a pyroelectric system for converting heat into electrical energy using a plurality of capacitors having temperature dependent capacitance. The application of heat decreases the dielectric constant in the capacitors causing the charge to expand from the capacitors into an electrical circuit to do electrical work.

U.S. Pat. No. 4,425,540, issued to Olsen discloses a pyroelectric apparatus for converting heat into electrical energy by the use of one or more capacitors having temperature dependent capacitance. The capacitor is cycled between relatively high and relatively low temperatures by successive thermal contact with relatively high and relatively low temperature portions of a heat transfer medium having a temperature gradient therein. Upon heating of the capacitor, the capacitance thereof is reduced, so that a charge therein is caused to expand into associated external circuitry in which it is available to do electrical work. The capacitor is then cooled and recharged and the cycle is repeated.

U.S. Pat. No. 4,441,067, issued to O'Hare, discloses a pyroelectric system wherein a convection column is used to produce a draft to draw alternately hot and then cool air over temperature variable capacitors on which a charge is placed. Alternate sets of capacitors are each repeatedly heated and cooled such that the total charge that is shared by the combined sets is made to cycle back and forth between the sets and to flow through a rectifier whereby useful electric power is extracted.

While the various systems disclosed in the prior art appear suitable for the specialized applications for which they are intended, there remains a need for a system that harnesses piezoelectric and pyroelectric effects to generate electric power for use on a localized basis. There further exists a need for such a system that may be incorporated directly into a structure, such as a house or other dwelling.

SUMMARY OF THE INVENTION

The present invention overcomes the disadvantages and limitations in the art by providing a roof system for a building or other structure fabricated so as to harness pyroelectric and piezoelectric effects to generate electric power. More particularly, the present invention provides a roof system for a building wherein roof tiles are adapted with piezoelectric materials capable of converting mechanical energy from falling rain into electric energy by compression or deformation of the piezoelectric material. In addition, the roof system is adapted with a pyroelectric system that generates electric power from temperature changes between the interior and exterior of the structure. Thermoelectric heat pumps may further be incorporated to harness the power generated for temperature conditioning interior spaces within the building. The use of polyvinylidene fluoride, a material having both piezoelectric and pyroelectric characteristics, is disclosed as a preferred material for accomplishing the goals of the present invention. Energy generated by the piezoelectric and pyroelectric systems may be stored by batteries for future use or converted to aid in cooling the structure using a thermoelectric cooling.

Accordingly, it is an object of the present invention to provide advancements in the generation of electrical power.

Another object of the present invention is to provide a simple and reliable system adapted for generating electrical power.

Still another object of the present invention is to provide a roof system capable of converting mechanical impact energy from rain into electrical power.

Yet another object of the present invention is to provide a roof system capable of converting thermal changes into electrical power.

DETAILED DESCRIPTION OF THE INVENTION

Figure 1:
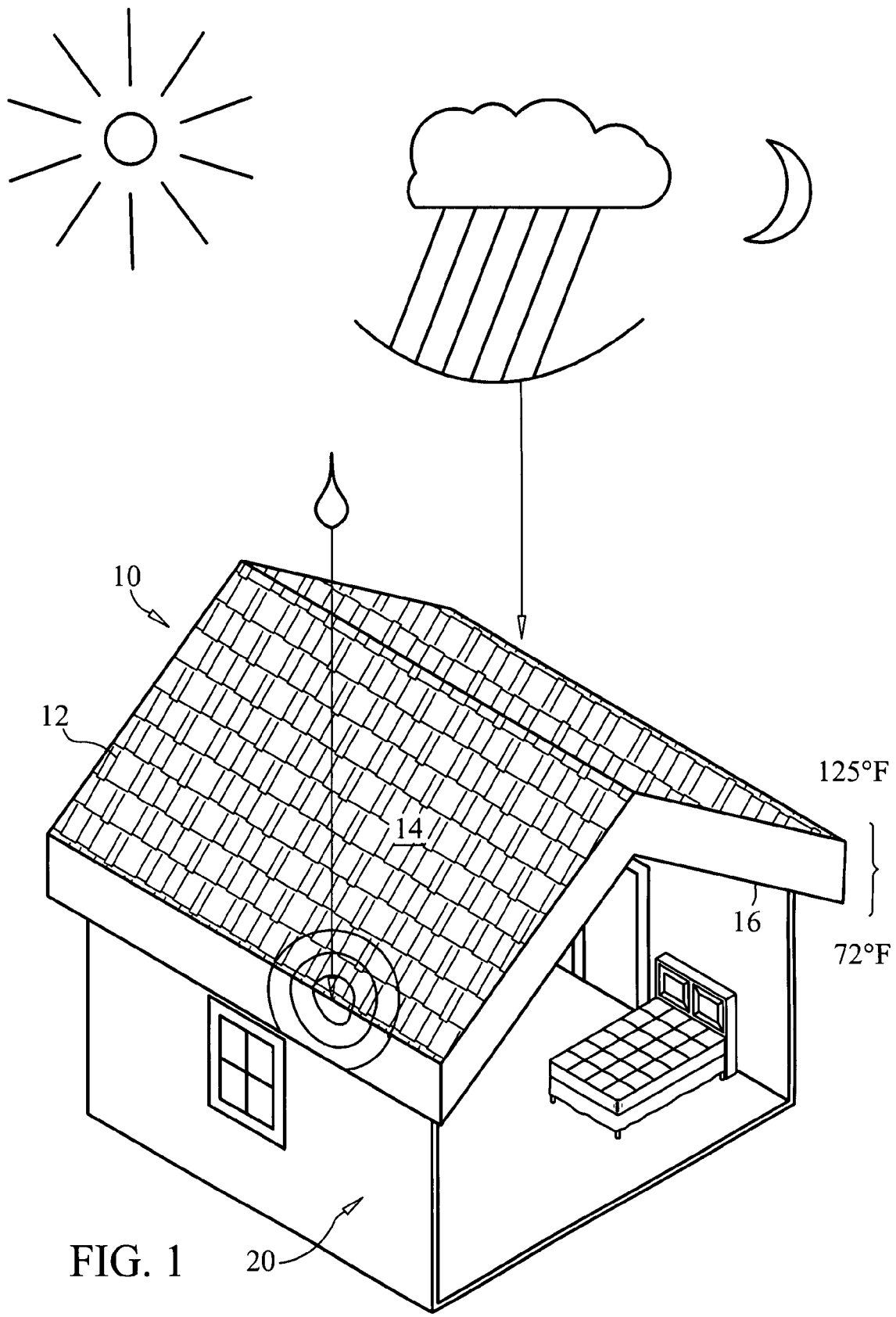
FIG. 1 illustrates a building adapted with a roof system adapted to convert mechanical and thermal energy into electrical energy according to the present invention.

With reference now to the drawings, FIGS. 1-7 illustrate and depict a preferred embodiment of a building roof system, generally referenced as 10, in accordance with the present invention. The present invention provides a system for generating electrical power preferably for a use with a building using a combination of pyroelectric and piezoelectric effects, and further provides means for temperature conditioning of the building's interior space using thermoelectric cooling. As best depicted in FIG. 1, in a preferred embodiment the present invention is fabricated in the form of a roof system 12. Roof system 12 is fabricated to function as a conventional roof for a house or dwelling 20, so as to provide protection from the elements such as wind, temperature and rain, and is further specifically fabricated to so as to harness pyroelectric and piezoelectric effects to generate electric power, which power is supplied to thermoelectric heat pump systems to aid in controlling the temperature of an interior space.

More particularly, the present invention provides a roof system wherein the roof is adapted with piezoelectric materials capable of converting mechanical energy from mechanical deflection into electric energy, such as may be caused by impact of falling rain and the resulting deformation of the piezoelectric material. Piezoelectricity is the ability of crystals to generate a voltage in response to applied mechanical stress. When a mechanical stress is applied, the symmetry of the crystals forming the piezoelectric material is disturbed, and the change in symmetry generates a voltage across the material. Accordingly, roof system 12 has an uppermost or top surface 14 fabricated from a piezoelectric material wherein a plurality of piezoelectric cells or sections are configured to deform when exposed to rain droplet impact. Deformation of the various piezoelectric cells generates an electrical current that may be stored by suitable battery or capacitor storage system, or immediately used such as in cooling, heating, lights etc.

In addition, the roof system 12 is adapted with a pyroelectric system that generates electric power from temperature changes experienced by the roof system. Pyroelectricity is the ability of certain materials to generate an electrical potential when heated or cooled. Pyroelectricity is a migration of positive and negative charges (and therefore establishment of electric polarization) to opposite ends of a crystal's polar axis as a result of change in temperature. Pyroelectricity can be visualized as one side of a triangle, where each corner represents energy states in the crystal: kinetic, electrical, and thermal energy. The side between electrical and thermal corners represents the pyroelectric effect and produces no kinetic energy. The side between the kinetic and electrical corners represents the piezoelectric effect and produces no heat. Accordingly, roof system 12 may further include pyroelectric cells or sections, wherein each section includes an upper surface exposed to the atmosphere and the sun and a lower surface 16 in thermal communication with the interior of the house or structure. In such a configuration the upper and lower surfaces will be exposed to different temperatures and resulting temperature fluxuations. Thus, in climates wherein rain storms and thundershowers rapidly form and dissipate, the temperature of the upper surface will change rapidly and significantly thereby providing a temperature change sufficient for the pyroelectric cells to generate electrical power. As illustrated in FIG. 1, the upper roof surface 14 of roof system 12 is heated by the sun to temperatures in excess of 125° F. while the interior of the structure may be maintained at a more comfortable 72° F. However, when the rains come the upper roof surface 14 rapidly cools thereby completing a pyroelectric cycle and generating an electric potential.

The use of polyvinylidene fluoride, a material having both piezoelectric and pyroelectric characteristics, provides a preferred material for accomplishing the goals of the present invention. Accordingly, roof system 12 may be fabricated from such a material. It should be noted, however, that any suitable material having piezoelectric and/or pyroelectric characteristics is considered within the scope of the present invention.

Figure 2:
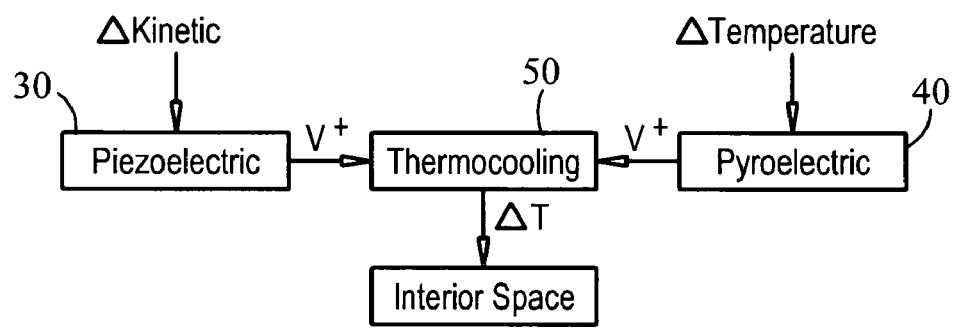
FIG. 2 is a block diagram illustrating the generation of electrical potentials via piezoelectric and pyroelectric systems and the use of generated electrical potential to by a thermoelectric heat pump to effect the temperature within an interior space.
Figure 3:
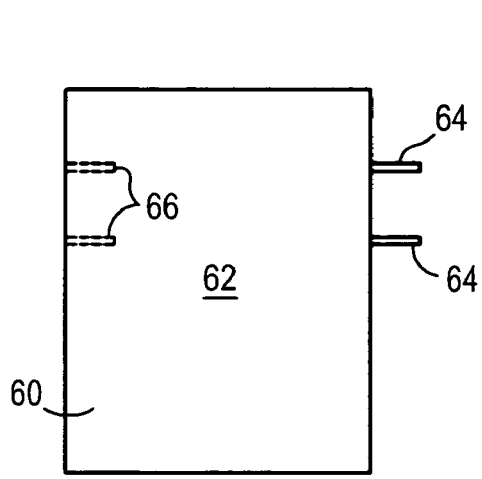
FIG. 3. is a top view of a roof tile fabricated with piezoelectric and pyroelectric material in accordance with the present invention.
Figure 4:
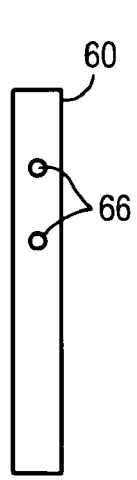
FIG. 4 is a left side view thereof.
Figure 5:
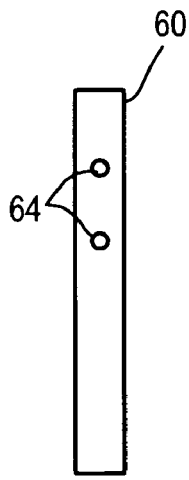
FIG. 5 is a right side view thereof.
Figure 6:
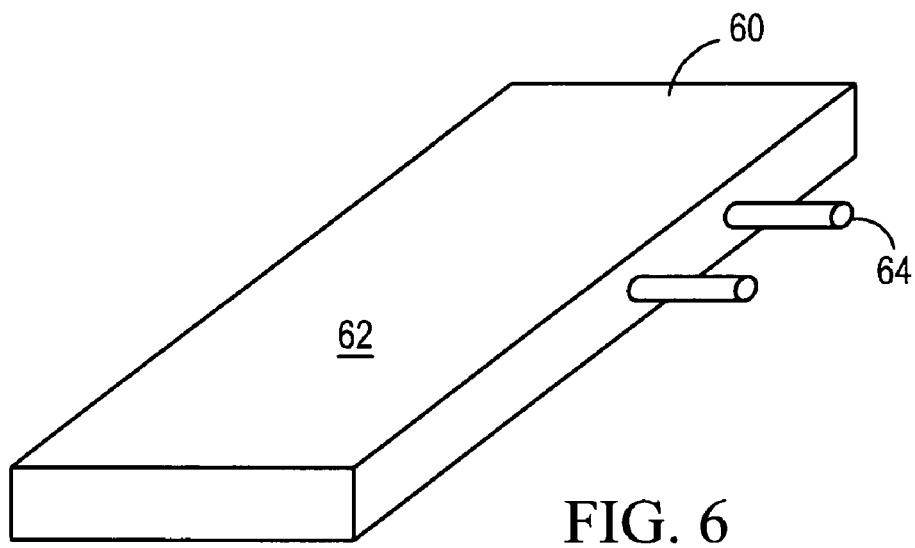
FIG. 6 is a perspective view thereof.

FIG. 2 is a system block diagram of a roof system according to the present invention. More particularly, the system includes a top surface incorporating a piezoelectric system, referenced as 30, that functions to convert kinetic energy (AK) into an electric potential (V+), and a pyroelectric system, referenced as 40 that functions to convert temperature changes ($\Delta$T) into an electric potential (V+). A thermoelectric heat pump, referenced as 50, is electrically connected to the piezoelectric and pyroelectric systems, either directly or via an intermediately connected battery-type power storage device, and is in thermal communication with the interior space so as to selectively convert the available electric potential to a change in temperature by either absorbing or rejecting heat from/to the interior space.

Accordingly, an embodiment is contemplated wherein the roof generates power from the changes in climactic temperature due to the pyroelectric effect, and changes in interior and exterior temperatures due to the thermoelectric effect. Thus, the use of a thermoelectric material, separate from the PZDT material, not only allows for the generation of a voltage potential, it allows for a charge to be generated from the difference in interior and exterior surfaces by means of a thermoelectric generator (TEG). In this embodiment, interior cooling can be accomplished by powering thermoelectric cooling (TEC) by means of the charge generated from pyroelectric roofing and/or piezoelectric roofing. In other words, as a day gets warmer over time, the pyroelectric materials generate a charge which can power the thermoelectric cooling semiconductors and aid in cooling the interior space. As this happens, heat is removed from the interior and brought to the exterior (the roof). This creates more of a temperature change in the pyroelectric material and generates more charge that in turn can drive the thermo cooling device, etc. As the structure cools, the difference in interior and exterior temperature becomes greater, allowing for a separate thermoelectric device to generate a charge and also drive the thermo cooling.

Figure 7:
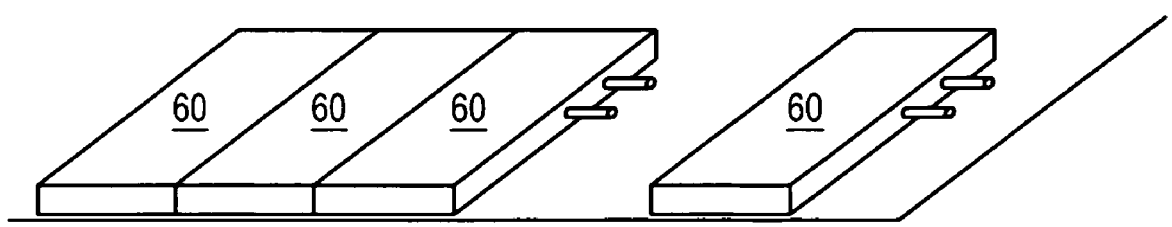
FIG. 7 is a partial perspective view of a roof system formed from said roof tiles.

FIGS. 3-7 depict a roof tile, referenced as 60, fabricated with PVDF material in accordance with the present invention. Roof tile 60 includes an upper surface 62 that provides an impact surface for rain, hail, and other impact material, for converting impact related deformation to an electric potential. Roof tile 60 is further adapted with projecting electrical output prongs 64, and an electrical input receptacle 66 for receiving output prongs from an adjacent tile. FIG. 7 depicts a plurality of tiles 60 installed in adjacent, electrically connected relation to form a roof structure.

The instant invention has been shown and described herein in what is considered to be the most practical and preferred embodiment. It is recognized, however, that departures may be made therefrom within the scope of the invention and that obvious structural and/or functional modifications will occur to a person skilled in the art.

What I claim is:

1. A roof system adapted for generating electrical energy, said roof system comprising:
    a roof having a top surface, said roof top surface incorporating piezoelectric material capable of generating electrical energy in response to small mechanical deformation sufficient to generate an electrical charge;
    said roof further incorporating pyroelectric material capable of generating electrical energy in response to ambient temperature changes;
    said roof member further including at least one thermoelectric electrical generating unit having a first portion in thermal communication with the interior space and a second portion in thermal communication with said roof member for generating electrical energy in response to temperature differential between said roof member and the interior space;
    means for consuming electrical energy generated by said piezoelectric material, said thermoelectric electrical generating unit, and said pyroelectric material;
    said means for consuming electrical energy including a thermoelectric heat pump in thermal communication with an interior space and in thermal communication with said roof.

2. A roof system adapted for generating electrical energy according to claim 1, wherein said piezoelectric material comprises polyvinylidene fluoride.

3. A roof system adapted for generating electrical energy according to claim 1, wherein said pyroelectric material comprises polyvinylidene fluoride.

4. A roof system adapted for generating electrical energy, said roof system installed on a structure over an interior space, said roof system comprising:
    a roof member including at least one piezoelectric surface for generating electrical energy in response to mechanical deformation of said surface caused by a rain drop impact;
    said roof member further incorporating pyroelectric material capable of generating electrical energy in response to ambient temperature changes;
    said roof member further including at least one thermoelectric electrical generating unit having a first portion in thermal communication with the interior space and a second portion in thermal communication with said roof member for generating electrical energy in response to temperature differential between said roof member and the interior space; and
    a thermo-electric heat pump electrically connected to said at least one piezoelectric electrical generating surface and said at least one pyroelectric generating unit, said thermo-electric heat pump in thermal communication with an interior space and in thermal communication with said roof member.

5. A roof system adapted for generating electrical energy, said roof system installed on a structure over an interior space, said roof system comprising:
    at least one roof covering member fabricated from polyvinylidene fluoride having piezoelectric and pyroelectric characteristics such that said member is capable of generating electrical energy in response to mechanical deformation of said member and is capable of generating electrical energy in response to ambient temperature changes;
    said roof covering member further including at least one thermoelectric electrical generating unit having a first portion in thermal communication with the interior space and a second portion in thermal communication with said roof member for generating electrical energy in response to temperature differential between said roof member and the interior space;
    a thermo-electric heat pump electrically connected to said roof covering member said thermo-electric heat pump in thermal communication with the interior space and in thermal communication with said roof covering member such that electrical energy generated by said roof covering member powers said thermo-electric heat pump to selectively extract heat from the interior space.

* * * * *